US011413867B2

(12) United States Patent
Goto et al.

(10) Patent No.: US 11,413,867 B2
(45) Date of Patent: Aug. 16, 2022

(54) PIEZOELECTRIC PUMP AND LIQUID EJECTION DEVICE

(71) Applicant: TOSHIBA TEC KABUSHIKI KAISHA, Tokyo (JP)

(72) Inventors: Taiki Goto, Shizuoka (JP); Kazuhiro Hara, Shizuoka (JP)

(73) Assignee: TOSHIBA TEC KABUSHIKI KAISHA, Tokyo (JP)

( * ) Notice: Subject to any disclaimer, the term of this patent is extended or adjusted under 35 U.S.C. 154(b) by 207 days.

(21) Appl. No.: 16/743,547

(22) Filed: Jan. 15, 2020

(65) Prior Publication Data

US 2020/0398571 A1 Dec. 24, 2020

(30) Foreign Application Priority Data

Jun. 21, 2019 (JP) .............................. JP2019-115714

(51) Int. Cl.
*B41J 2/14* (2006.01)
*B41J 2/045* (2006.01)
*H01L 41/09* (2006.01)
*F04B 43/02* (2006.01)

(52) U.S. Cl.
CPC .......... *B41J 2/14233* (2013.01); *B41J 2/045* (2013.01); *F04B 43/02* (2013.01); *H01L 41/0973* (2013.01)

(58) Field of Classification Search
CPC ... B41J 2/14233; B41J 2/045; H01L 41/0973; F04B 43/02
See application file for complete search history.

(56) References Cited

U.S. PATENT DOCUMENTS

| 2010/0073437 | A1 | 3/2010 | Shibata et al. |
| 2013/0017063 | A1 | 1/2013 | Tay et al. |
| 2015/0174910 | A1 | 6/2015 | Kaneko |
| 2016/0059547 | A1 | 3/2016 | Kaneko |
| 2017/0087864 | A1 | 3/2017 | Akishiba et al. |
| 2017/0297346 | A1 | 10/2017 | Ohtsu et al. |
| 2019/0092034 | A1 | 3/2019 | Goto et al. |
| 2019/0092035 | A1 | 3/2019 | Hara et al. |
| 2019/0249656 | A1* | 8/2019 | Takahashi ............. F04B 43/043 |

FOREIGN PATENT DOCUMENTS

| CN | 1397734 | A | 2/2003 |
| CN | 106183424 | A | 12/2016 |
| CN | 107303760 | A | 10/2017 |
| CN | 108468636 | A | 8/2018 |
| CN | 109551896 | A | 4/2019 |
| CN | 109551897 | A | 4/2019 |
| EP | 3235650 | A1 | 10/2017 |
| EP | 3459746 | A1 | 3/2019 |
| JP | 2000265963 | A | 9/2000 |
| JP | 2013060851 | A | 4/2013 |

OTHER PUBLICATIONS

Extended European Search Report dated Jul. 21, 2020, mailed in counterpart European Application No. 20159393.6, 10 pages.

\* cited by examiner

*Primary Examiner* — Henok D Legesse
(74) *Attorney, Agent, or Firm* — Kim & Stewart LLP

(57) ABSTRACT

According to an embodiment, a piezoelectric pump includes a pressure chamber and a buffer chamber. The buffer chamber is provided for at least one of an inlet of the pressure chamber in which liquid flows or an outlet of the pressure chamber from which the liquid is discharged. The buffer chamber includes a wall portion that forms a gas chamber that retains gas from the liquid.

6 Claims, 12 Drawing Sheets

PIEZOELECTRIC PUMP AND LIQUID EJECTION DEVICE

CROSS-REFERENCE TO RELATED APPLICATIONS

This application is based upon and claims the benefit of priority from the prior Japanese Patent Application No. 2019-115714, filed on Jun. 21, 2019, the entire contents of which are incorporated herein by reference.

FIELD

An embodiment to be described here generally relates to a piezoelectric pump and a liquid ejection device.

BACKGROUND

A liquid ejection device can be used, for example, in a recording apparatus having a ink circulating system such as inkjet heads or other apparatuses. A technique of using a piezoelectric pump in a liquid ejection device is known. The piezoelectric pump suctions liquid from an inlet and ejects the liquid from an outlet by changing the volume of a pressure chamber. The volume of the pressure chamber changes due to a bending displacement of a diaphragm.

There is also known a piezoelectric pump including a buffer chamber on a primary side and a secondary side of a pressure chamber. Gas may be retained in the buffer chamber. The gas retained in the buffer chamber functions as a damper to absorb and dissipate pressure fluctuations generated by a bending change of a diaphragm. Further, it is also conceivable that the gas retained in the buffer chamber increases the flow volume of the liquid.

DETAILED DESCRIPTION

According to one embodiment, a piezoelectric pump includes, a pressure chamber, a diaphragm, a first check valve, a second check valve, a buffer chamber, a port, and a wall portion. The pressure chamber has a variable volume. The pressure chamber includes an inlet and an outlet on a bottom. The liquid flows in to the pressure chamber via the inlet and is discharged from the pressure chamber via the outlet. The diaphragm deforms to change a volume of the pressure chamber. The first check valve is provided for the inlet and regulates flow of the liquid. The second check valve is for the outlet and also regulates flow of the liquid. The buffer chamber is provided on at least one of the inlet side from which the liquid flows or the outlet side from which the liquid is discharged. The port is connectable to the buffer chamber. The wall portion is provided in the buffer chamber and forms a gas chamber, which retains gas from the liquid flowing in the buffer chamber.

Figure 1:
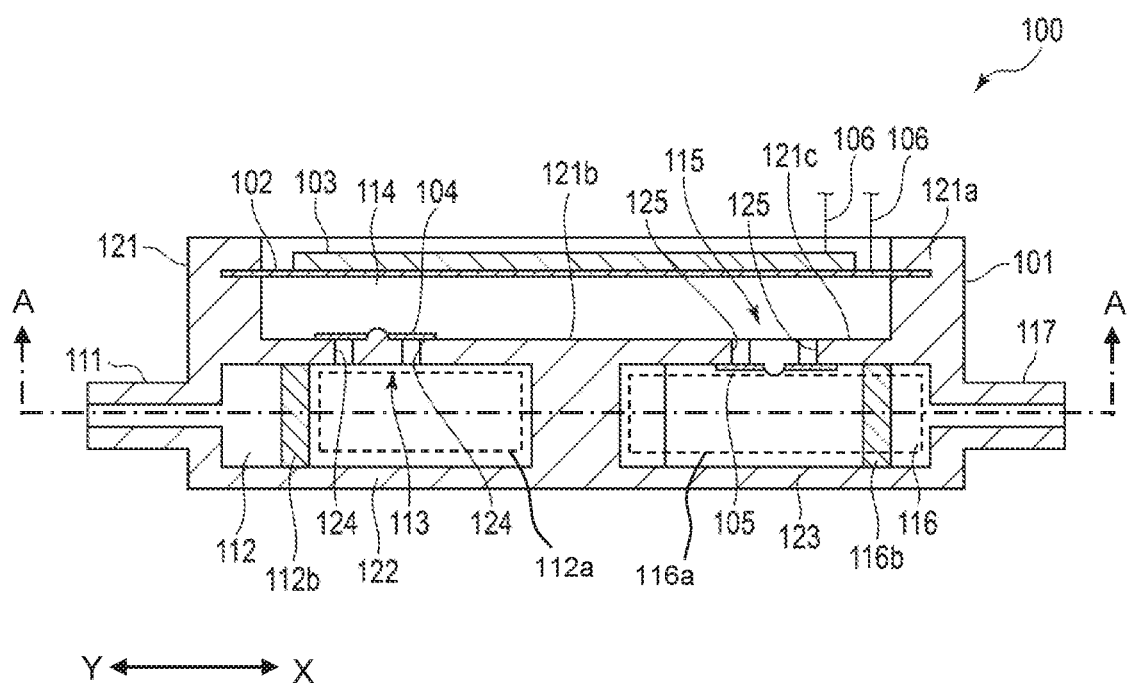
FIG. 1 is a cross-sectional view of a configuration of a piezoelectric pump according to an embodiment.
Figure 2:
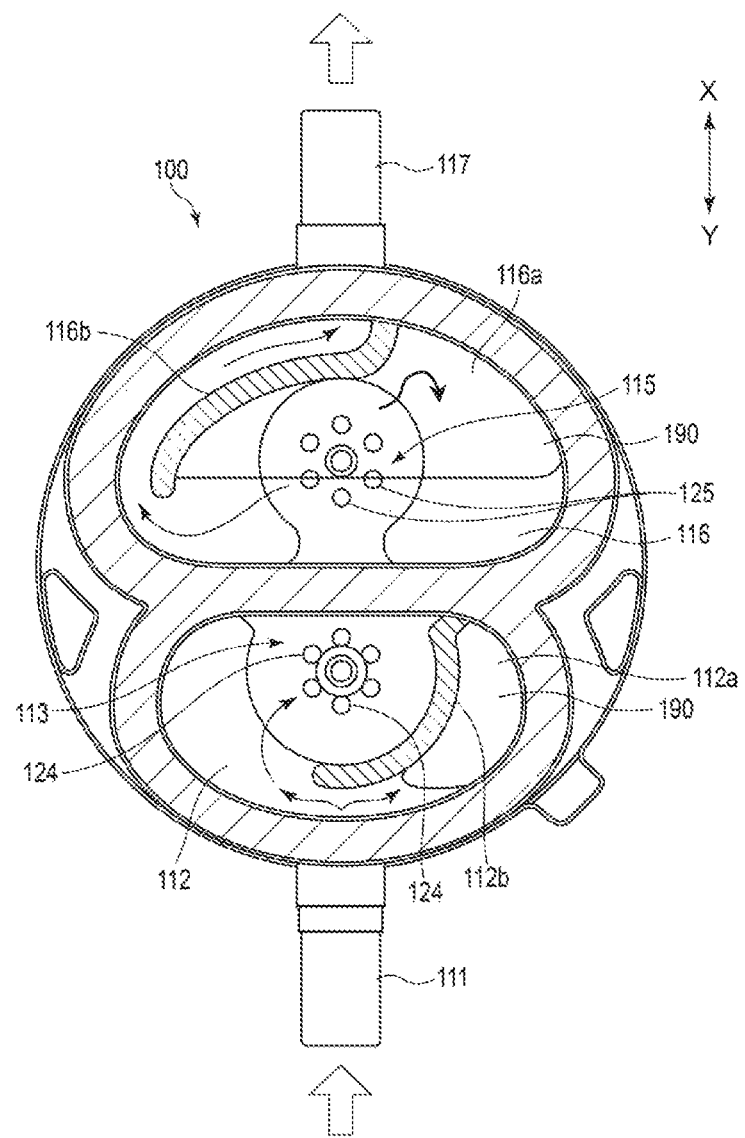
FIG. 2 is a partial cross-sectional view illustrating configurations of a first buffer chamber and a second buffer chamber of the piezoelectric pump according to the embodiment.
Figure 3:
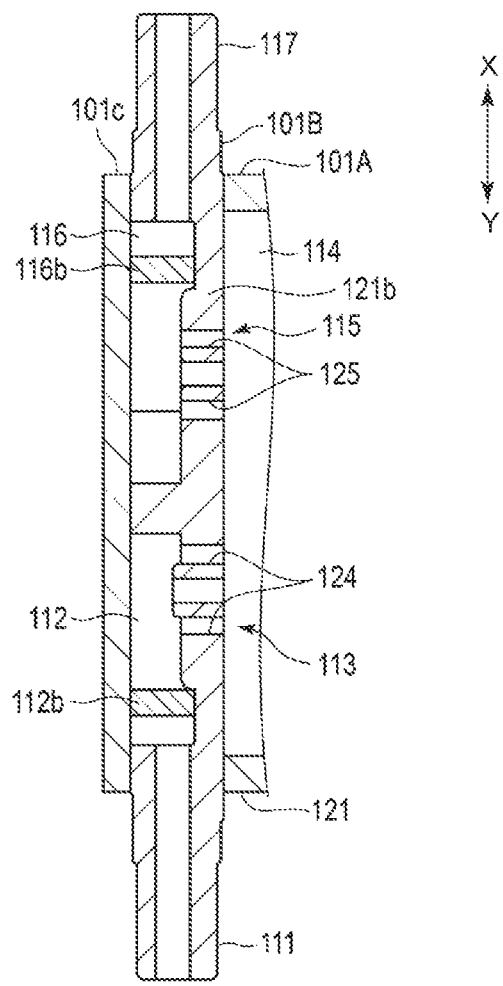
FIG. 3 is a cross-sectional view describing a configuration of a member a pump main body of the piezoelectric pump according to the embodiment.
Figure 4:
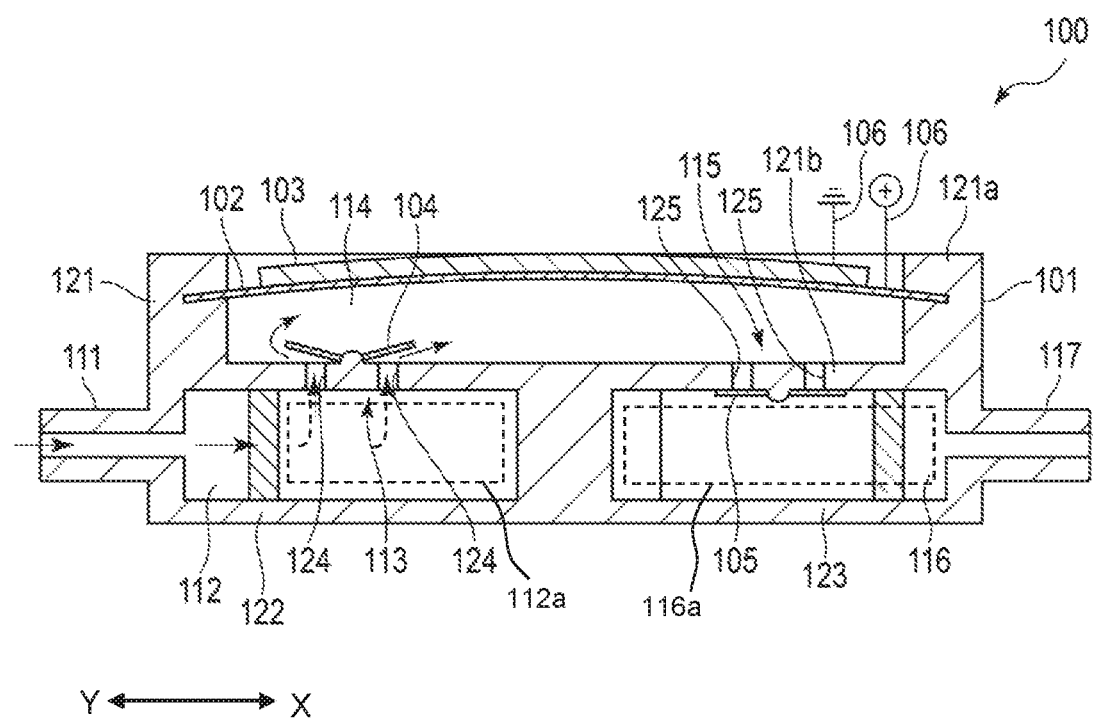
FIG. 4 is a cross-sectional view of the diaphragm and the piezoelectric element of the piezoelectric pump according to the embodiment, illustrating an example of a bending displacement.
Figure 5:
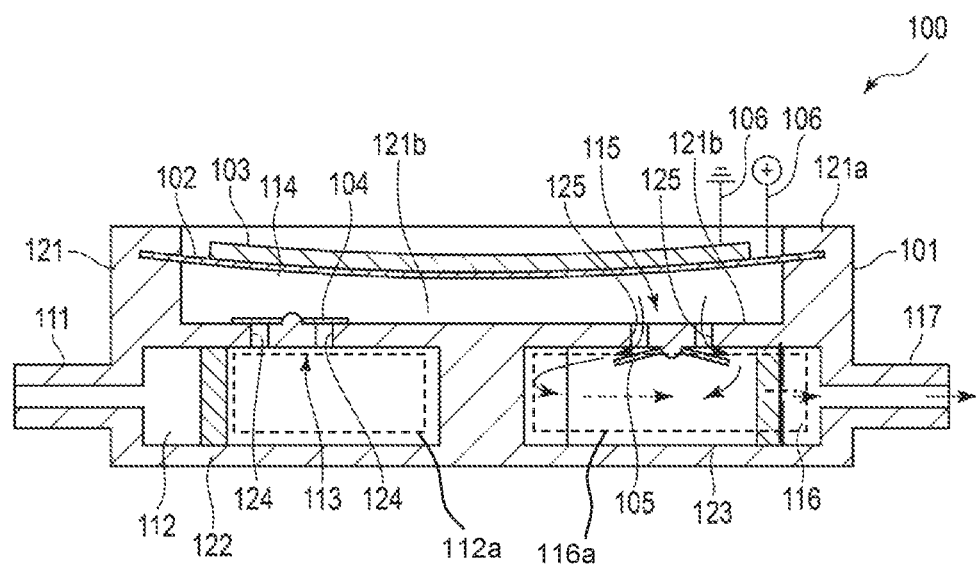
FIG. 5 is a cross-sectional view of the diaphragm and the piezoelectric element of the piezoelectric pump according to the embodiment, illustrating an example of a bending displacement.
Figure 6:
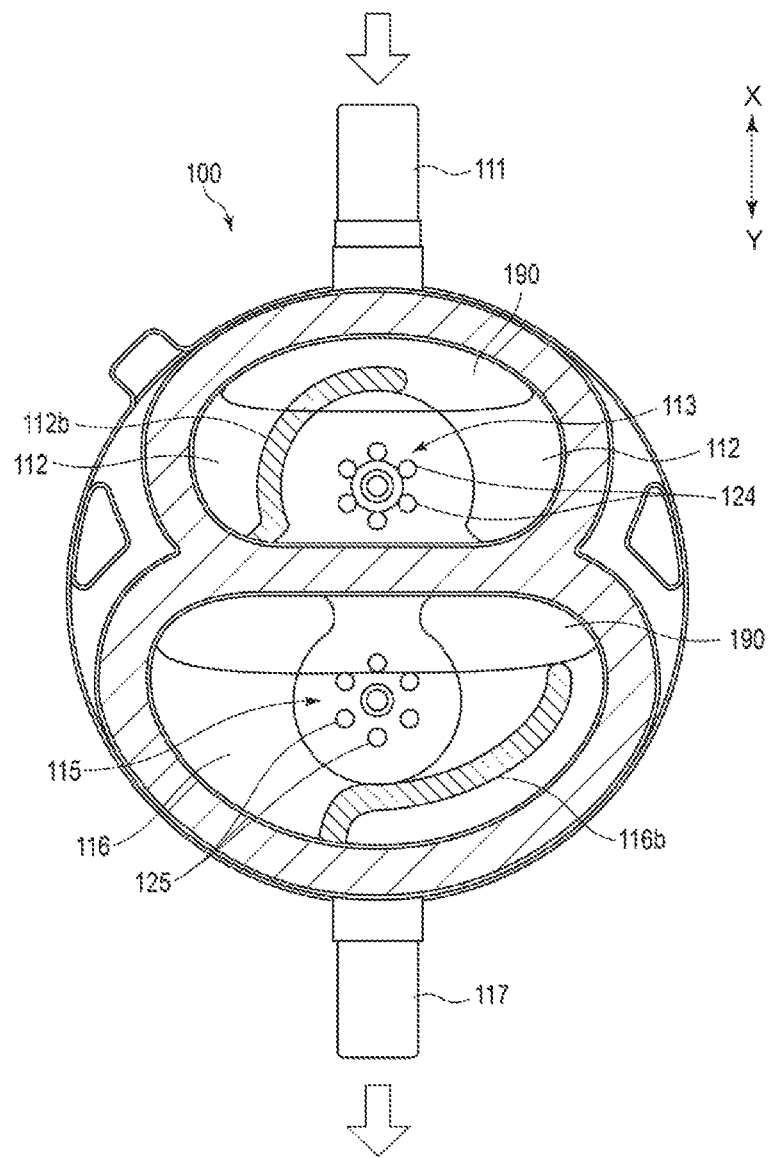
FIG. 6 is a cross-sectional view illustrating an example of use of the piezoelectric pump according to the embodiment.
Figure 7:
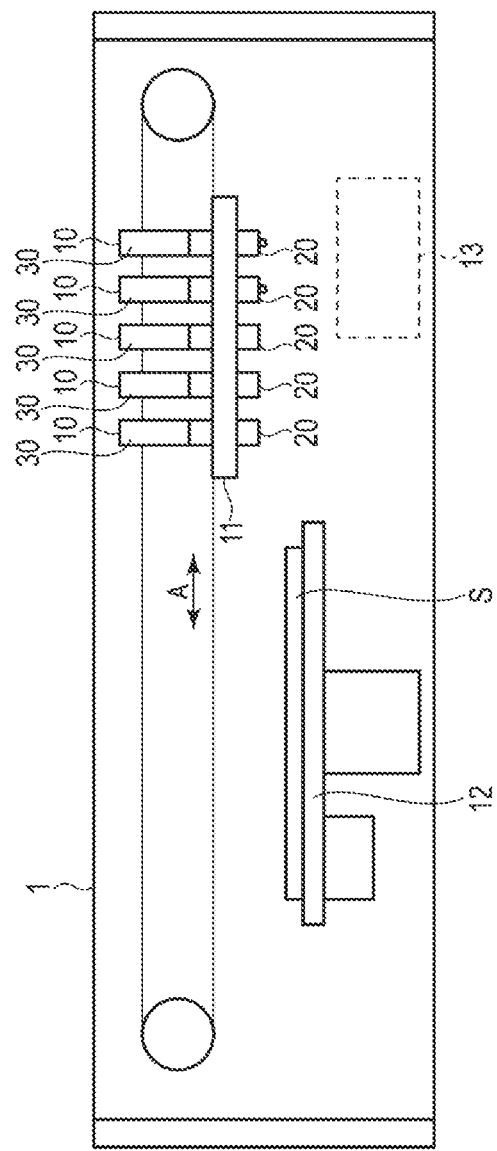
FIG. 7 is a side view of an internal configuration of a recording apparatus according to the embodiment.
Figure 8:
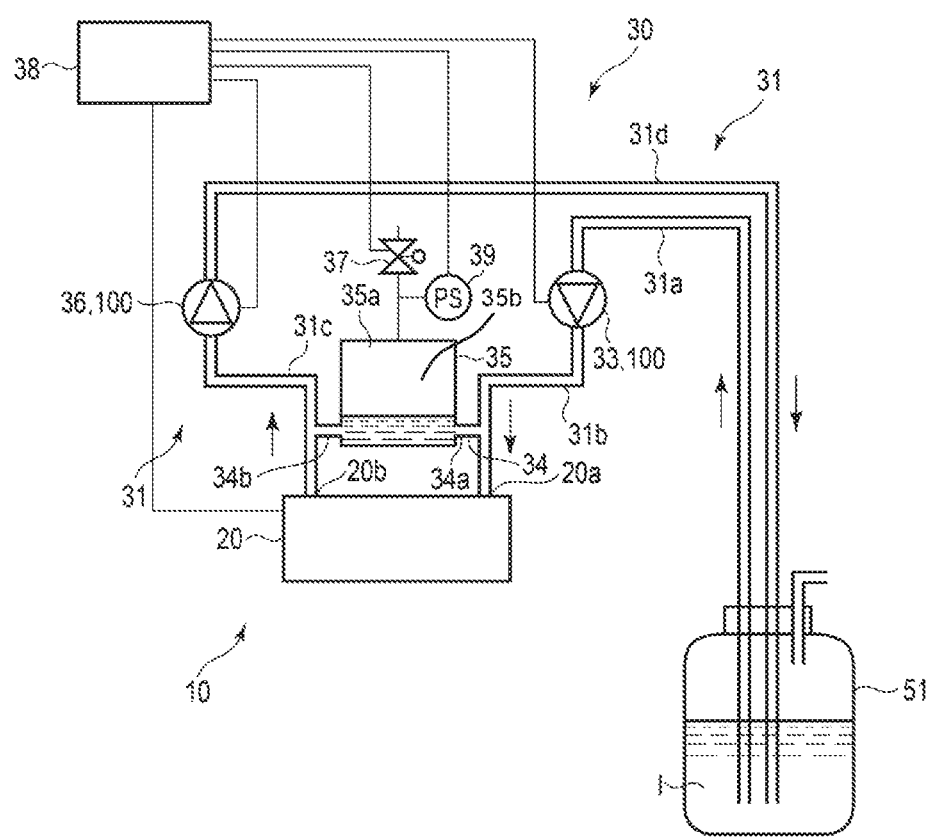
FIG. 8 is a diagram illustrating a configuration of a liquid ejection device used in the recording apparatus according to the embodiment.
Figure 9:
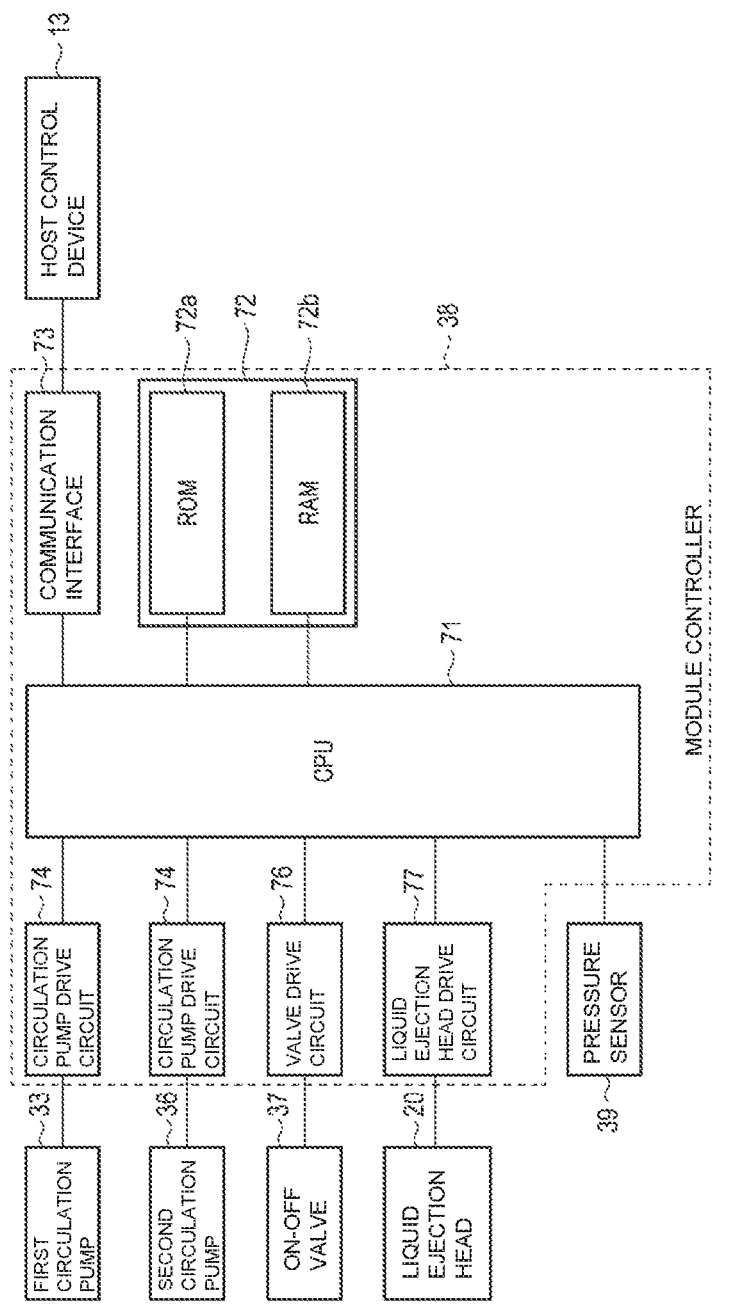
FIG. 9 is a block diagram illustrating a configuration of a module controller used in the recording apparatus according to the embodiment.

Hereinafter, a piezoelectric pump 100, a liquid ejection device 10 using the piezoelectric pump 100, and a recording apparatus 1 including the liquid ejection device 10 using the piezoelectric pump 100 according to an embodiment will be described with reference to FIGS. 1 to 9. FIG. 1 illustrates a cross-sectional configuration of a piezoelectric pump 100 according to the embodiment. FIG. 2 illustrates cross-sectional configurations of a first buffer chamber 112 and a second buffer chamber 116 used in the piezoelectric pump 100 as viewed from the A-A direction in FIG. 1. FIG. 3 illustrates a configuration of a member of a pump main body 101 of the piezoelectric pump 100 in FIG. 1. FIG. 4 and FIG. 5 each illustrate a diaphragm 102 and a piezoelectric element 103 of the piezoelectric pump 100, illustrating an example of bending. FIG. 6 illustrates an example in the case where the up-and-down direction of the piezoelectric pump 100 is reversed from the posture in FIG. 2. FIG. 7 illustrates a configuration of the recording apparatus 1. FIG. 8 illustrates a configuration of the liquid ejection device 10 used in the recording apparatus 1. FIG. 9 illustrates a configuration of a module controller 38 used in the recording apparatus 1. Note that in FIG. 2, FIG. 4, and FIG. 5, solid arrows or dotted arrows in the first and second buffer chambers 112 and 116 indicate the flow of liquid. Further, in the figures, the same reference symbol represents the same or a similar portion. Further, in the figures, the configuration is increased in size, reduced in size, or omitted as appropriate.

(Piezoelectric Pump 100)

First, the piezoelectric pump 100 according to the embodiment will be described with reference to FIGS. 1 to 6. The piezoelectric pump 100 is a so-called diaphragm pump. The piezoelectric pump 100 transports various types of liquid such as ink, pharmaceutical products, and analytical reagents. In this embodiment, the piezoelectric pump 100 transports ink as liquid. Further, in this embodiment, the piezoelectric pump 100 is mounted in a recording apparatus 1 including a plurality of liquid ejection devices 10.

As illustrated in FIG. 1, the piezoelectric pump 100 includes the pump main body 101, the diaphragm 102, the piezoelectric element 103, the first check valve 104, and a second check valve 105. Further, the piezoelectric pump 100 includes a first port 111, a first buffer chamber 112, an inlet 113, the pressure chamber 114, an outlet 115, a second buffer chamber 116, and a second port 117.

The first port 111 is connected to piping or the like (not shown) that supplies liquid to a primary side of the piezoelectric pump 100. For example, as illustrated in FIG. 1, the first port 111 is connected to the first buffer chamber 112. For example, the first port 111 is formed of a part of the pump main body 101. For example, the first port 111 is formed in a cylinder connectable to the piping.

As illustrated in FIG. 1 to FIG. 6, the first buffer chamber 112 is provided to a secondary side of the first port 111 and also to a primary side of the pressure chamber 114. The liquid supplied to the first port 111 flows into the pressure chamber 114 through the first buffer chamber 112. The first buffer chamber 112 forms a space having a predetermined volume. As illustrated in FIG. 2, for example, the first buffer chamber 112 includes a first wall portion 112b that partitions the space inside the first buffer chamber 112 to form a first gas chamber 112a.

For example, as illustrated in FIG. 2, one end of the first wall portion 112b in the Y direction is separated from the inner surface of the first buffer chamber 112 in the posture in which the piezoelectric pump 100 is provided to the recording apparatus 1. The first wall portion 112b is formed integrally with the inner surface of the first buffer chamber 112 except for the end on the Y direction side. Note that in FIG. 2, FIG. 3, and FIG. 6, the X direction is a direction opposite to the gravity direction, and the Y direction is the gravity direction.

For example, the first wall portion 112b is formed integrally with two inner surfaces of the first buffer chamber 112 opposed in the thickness direction of the first buffer chamber 112, i.e., the axial direction of the inlet 113. Further, for example, the first wall portion 112b has one end provided integrally with the inner circumferential surface of the first buffer chamber 112 and the other end provided away from the inner circumferential surface of the first buffer chamber 112.

As a specific example, one end of the first wall portion 112b is provided integrally with the inner surface of the first buffer chamber 112 on the second buffer chamber 116 side. The other end of the first wall portion 112b is provided at a position away from the first port 111 to face the first port 111. Further, the first wall portion 112b is curved at a predetermined radius of curvature so as to avoid the inlet 113.

As a result, as shown in FIG. 2, the first wall portion 112b disturbs the flow of liquid flown from the first port 111 into the first buffer chamber 112, and moves a gas 190 contained in the liquid to a gas chamber 112a. Further, the first wall portion 112b retains the gas 190 in the first gas chamber 112a. Further, the first gas chamber 112a is positioned on the X direction side in the first buffer chamber 112 with respect to at least the first port 111, and a portion of the first gas chamber 112a on the X direction side is closed in the posture in which the piezoelectric pump 100 is provided to the recording apparatus 1.

The inlet 113 fluidly connects the first buffer chamber 112 and the pressure chamber 114 to each other. That is, the inlet 113 is a hole for fluidly connecting the first buffer chamber 112 and the pressure chamber 114 of the pump main body 101 to each other. For example, the inlet 113 includes a plurality of first holes 124. The first check valve 104 is provided on the pressure chamber 114 side of the inlet 113. As a result, the inlet 113 causes liquid to flow from the first buffer chamber 112 to the pressure chamber 114, and regulates the flow of liquid from the pressure chamber 114 to the first buffer chamber 112.

As illustrated in FIG. 1, for example, the pressure chamber 114 includes the pump main body 101, the diaphragm 102, and the piezoelectric element 103. The pressure chamber 114 is formed to have a predetermined volume. Further, the volume of the pressure chamber 114 varies when the piezoelectric element 103 provided to the diaphragm 102 bends and when the diaphragm 102 deforms.

As a specific example, the pressure chamber 114 is configured by a recess 121 having a bottomed cylindrical shape, which is formed in the pump main body 101, the diaphragm 102 provided on the opening end side of the recess 121, and the piezoelectric element 103 provided to the outer surface of the diaphragm 102. In the pressure chamber 114, the inlet 113 and the outlet 115 are provided to a bottom portion 121b of the recess 121 of the pump main body 101, the bottom portion 121b facing the diaphragm 102. The first check valve 104 and the second check valve 105 respectively provided in the inlet 113 and the outlet 115 regulate a direction of the flow of liquid in the pressure chamber 114. As a specific example, in the pressure chamber 114, liquid flows from the inlet 113 and is then discharged from the outlet 115.

The outlet 115 fluidly connects the pressure chamber 114 and the second buffer chamber 116 to each other. That is, the outlet 115 is a hole for fluidly connecting the pressure chamber 114 and the second buffer chamber 116 of the pump main body 101 to each other. For example, the outlet 115 includes a plurality of second holes 125. The second check valve 105 is provided on the second buffer chamber 116 side of the outlet 115. As a result, the outlet 115 causes liquid to flow from the pressure chamber 114 to the second buffer chamber 116, and regulates the flow of liquid from the second buffer chamber 116 to the pressure chamber 114.

The second buffer chamber 116 is provided to a secondary side of the pressure chamber 114 and also to a primary side of the second port 117. The second buffer chamber 116 forms a space having a predetermined volume. The second buffer chamber 116 includes a second wall portion 116b that partitions the space inside the second buffer chamber 116 to form a second gas chamber 116a.

As illustrated in FIG. 2, for example, one end of the second wall portion 116b in the Y direction is separated from the inner surface of the second buffer chamber 116 in the posture in which the piezoelectric pump 100 is provided to the recording apparatus 1. The second wall portion 116b is formed integrally with the inner surface of the second buffer chamber 116 except for the end on the Y direction side.

For example, the second wall portion 116b is formed integrally with two inner surfaces of the second buffer chamber 116 opposed in the thickness direction of the second buffer chamber 116, i.e., the axial direction of the inlet 113. Further, for example, the second wall portion 116b has one end provided integrally with the inner circumferential surface of the second buffer chamber 116 and the other end provided away from the inner circumferential surface of the second buffer chamber 116.

As a specific example, one end of the second wall portion 116b is provided integrally with the inner surface of the second buffer chamber 116 adjacent to the second port 117. The other end of the second wall portion 116b is provided at a position away from the inner surface of the second buffer chamber 116 on the first buffer chamber 112 side to face the inner surface. Further, the second wall portion 116b is curved at a predetermined radius of curvature from one end to the other end so as to avoid the outlet 115 and face the second port 117 at the one end.

As a result, as shown in FIG. 2, the second wall portion 116b causes the liquid flown from the outlet 115 into the second buffer chamber 116 to move around the other end of the second wall portion 116b to the second port 117. Further, the second wall portion 116b retains, in the gas chamber 116a that is a space including the outlet 115, the gas 190 contained in the liquid. Further, the second gas chamber 116a is positioned on the X direction side in the second buffer chamber 116 with respect to at least the second port 117, and a portion of the second gas chamber 116a on the X direction side is blocked in the posture in which the piezoelectric pump 100 is provided to the recording apparatus 1.

The second port 117 is connected to piping or the like provided on a secondary side of the piezoelectric pump 100. The second port 117 is connected to the second buffer chamber 116. For example, the second port 117 is formed of a part of the pump main body 101. For example, the second port 117 is formed in a cylinder connectable to the piping. Further, the first port 111 and the second port 117 are disposed on the same axis.

The pump main body 101 forms the first port 111, the first buffer chamber 112, the inlet 113, a part of the pressure chamber 114, the outlet 115, the second buffer chamber 116, and the second port 117.

The pump main body 101 includes the recess 121 having a bottomed cylindrical shape, for example, at one end in an axis direction. The pump main body 101 includes the first port 111 and the second port 117 each having a cylindrical shape, for example, on an outer circumferential surface of the pump main body 101 on the other end side in the axis direction. The pump main body 101 includes, for example, a first hollow portion 122 and a second hollow portion 123. The first hollow portion 122 is fluidly connected to the first port 111. The second hollow portion 123 is fluidly connected to the second port 117. Further, the pump main body 101 includes, for example, the plurality of first holes 124 and the plurality of second holes 125. The plurality of first holes 124 connect the recess 121 and the first hollow portion 122 to each other. The plurality of second holes 125 connect the recess 121 and the second hollow portion 123 to each other.

The plurality of first holes 124 forms the inlet 113. The plurality of second holes 125 form the outlet 115. As illustrated in FIG. 2, for example, the plurality of first holes 124 and the plurality of second holes 125 are provided to the bottom portion 121b, and positioned on the line connecting the first port 111 and the second port 117. Further, the plurality of first holes 124 and the plurality of second holes 125 are provided at approximately symmetrical positions of the bottom portion 121b.

The recess 121 forms the pressure chamber 114 together with the diaphragm 102. The first hollow portion 122 forms the first buffer chamber 112. The second hollow portion 123 forms the second buffer chamber 116. For example, the first buffer chamber 112 and the second buffer chamber 116 may have substantially the same volume. For example, the volume of the first buffer chamber 112 may be smaller than that of the second buffer chamber 116. For example, in FIG. 2 and FIG. 3, an example in which the volume of the first buffer chamber 112 is smaller than that of the second buffer chamber 116 is illustrated. In such a configuration, the outlet 115 including the plurality of second holes 125 is favorably disposed at the center position of the second buffer chamber 116.

As illustrated in FIG. 3, the pump main body 101 is formed by, for example, integrating a plurality of members.

As a specific example, the pump main body 101 includes, for example, a first member 101A, a second member 101B, and a third member 101C as illustrated in FIG. 3. The first member 101A, the second member 101B, and the third member 101C are integrally assembled. The first member 101A forms, for example, a peripheral wall portion 121a of the recess 121. The second member 101B forms the first port 111, the bottom portion 121b, a peripheral wall of the first hollow portion 122, a peripheral wall of the second hollow portion 123, the first holes 124, the second holes 125, and the second port 117. The bottom portion faces the diaphragm 102 of the recess 121. The third member 101C covers the peripheral wall of the first hollow portion 122 and the peripheral wall of the second hollow portion 123 provided to the second member 101B.

The diaphragm 102 is, for example, a disc-like metal plate. For example, the diaphragm 102 is made of stainless material. For example, in order to avoid direct contact with liquid, the diaphragm 102 includes a coating layer made of resin material on the surface on the pressure chamber 114 side. The diaphragm 102 is connected to, for example, a device that supplies an alternating-current (AC) voltage via wiring 106, e.g., a circulation pump drive circuit 74 of the module controller 38 of the recording apparatus 1. The module controller 38 will be described later. Note that the material forming the diaphragm 102 is not limited to the stainless material, and the material may be, for example, a material such as nickel, brass, gold, silver, or copper.

The piezoelectric element 103 is piezoelectric ceramics. The piezoelectric element 103 is formed of, for example, lead zirconate titanate (PZT). The piezoelectric element 103 is, for example, a circular plate having an outer diameter, which is smaller than the outer diameter of the diaphragm 102 and the inner diameter of the peripheral wall portion 121a of the recess 121. The piezoelectric element 103 is connected to, for example, the circulation pump drive circuit 74 of the module controller 38 via the wiring 106.

The piezoelectric element 103 is fixed to the outer surface of the diaphragm 102, that is, a surface of the diaphragm 102, which is opposite to the surface on the pressure chamber 114 side, with an adhesive agent or the like. The piezoelectric element 103 is polarized in a thickness direction, and expands and contracts in a surface direction when an electric field is applied in the thickness direction.

The piezoelectric element 103 constitutes an actuator together with the diaphragm 102. When an AC voltage is applied to the piezoelectric element 103 in the thickness direction, the piezoelectric element 103 expands and contracts in the surface direction, and the diaphragm 102 deforms by deformation of the piezoelectric element 103 to increase or decrease the volume of the pressure chamber 114. Note that the material forming the piezoelectric element 103 is not limited to PZT, and other materials may be used.

The first check valve 104 is provided to the bottom portion 121b of the recess 121 to cover the inlet 113. The first check valve 104 prevents the liquid from flowing backward from the pressure chamber 114 to the first buffer chamber 112. The first check valve 104 is made of material resistant to liquid. In this embodiment, the first check valve 104 is made of, for example, polyimide material.

This is because the polyimide material is resistant to various ink materials such as water-based ink, oil-based ink, volatile solvent ink, and ultraviolet (UV) ink, which are liquid to be ejected in the recording apparatus 1. Note that the first check valve 104 may also be made of, in place of polyimide, various materials including resins or metals highly resistant to ink, such as polyethylene terephthalate (PET), ultrahigh molecular weight polyethylene (PE), polypropylene (PP), polyphenylene sulfide (PPS), polyether ether ketone (PEEK), perfluoro alkoxy alkane (PFA), perfluoro ethylene propylene copolymer (FEP), ethylene-tetrafluoroethylene (ETFE), polytetrafluoroethylene (PTFE), aluminum, stainless, and nickel. Note that any material resistant to liquid can be selected as the first check valve 104 as appropriate.

The second check valve 105 is provided within the second buffer chamber 116 to cover the outlet 115. The second check valve 105 prevents the liquid from flowing backward from the second buffer chamber 116 to the pressure chamber 114. The second check valve 105 is made of the same material as the material of the first check valve 104.

Next, an operation example of the piezoelectric pump 100 thus configured will be described with reference to FIGS. 1 to 5. Further, as illustrated in FIG. 2 and FIG. 3, the piezoelectric pump 100 is used in the posture in which the first port 111 is positioned on the Y direction side, the second port 117 is positioned on the X direction side, and the line connecting the first port 111 and the second port 117 is along the XY direction.

First, when an AC voltage with a predetermined waveform is applied to the wiring 106 connected to the diaphragm 102 and the piezoelectric element 103 illustrated in FIG. 1, the piezoelectric element 103 bends to move in a direction away from the bottom portion 121b of the recess 121 as illustrated in FIG. 4. When the piezoelectric element 103 bends, the diaphragm 102 also bends to move away from the bottom portion 121b of the recess 121. This increases the volume of the pressure chamber 114.

As the volume of the pressure chamber 114 increases, the pressure chamber 114 is depressurized. Thus, the pressure within the first buffer chamber 112 becomes higher than the pressure within the pressure chamber 114, and the first check valve 104 opens. Therefore, as indicated by the arrows in FIG. 4, the liquid within the first buffer chamber 112 other than the first gas chamber 112a moves to the pressure chamber 114 through the inlet 113. Further, when the liquid within the first buffer chamber 112 moves into the pressure chamber 114, liquid flows from the first port 111 into the first buffer chamber 112. At this time, the flow of the liquid flown from the first port 111 is disturbed by the other end positioned at the lower end of the first wall portion 112b, and a part of the gas in the liquid moves along the first wall portion 112b to the first gas chamber 112a partitioned by the first wall portion 112b of the first buffer chamber 112.

Next, when a voltage opposite to the voltage applied to the piezoelectric element 103 in the state illustrated in FIG. 4 is applied to the piezoelectric element 103, the piezoelectric element 103 bends in a direction coming close to the bottom portion 121b of the recess 121 as illustrated in FIG. 5. When the piezoelectric element 103 bends, the diaphragm 102 also bends to come close to the bottom portion 121b of the recess 121. This decreases the volume of the pressure chamber 114.

As the volume of the pressure chamber 114 decreases, the pressure chamber 114 is pressurized. Thus, the pressure within the pressure chamber 114 becomes higher than the pressure within the second buffer chamber 116, and the second check valve 105 opens. Further, at that time, the pressure within the pressure chamber 114 becomes higher than the pressure within the first buffer chamber 112, and the first check valve 104 closes. Therefore, as indicated by the arrows in FIG. 5, the liquid within the pressure chamber 114 moves to the second buffer chamber 116 through the outlet 115.

Further, a part of the air in the liquid that has moved to the second buffer chamber 116 is kept in the second gas chamber 116a partitioned by the second wall portion 116b where there is the outlet 115. Further, the liquid that has moved to the second buffer chamber 116 passes through the other end at the lower end of the second wall portion 116b and between the inner surface of the second buffer chamber 116 and the second wall portion 116b, and moves to the second port 117. The liquid that has moved to the second port 117 moves from the second port 117 to the secondary side of the piezoelectric pump 100.

As described above, if the AC voltage is continuously applied to the piezoelectric element 103, the piezoelectric element 103 repeats a bending displacement to move away from the bottom portion 121b, which is illustrated in FIG. 4, and a bending displacement to come close to the bottom portion 121b, which is illustrated in FIG. 5. Therefore, the liquid flows from the first port 111 to the second port 117 through the first buffer chamber 112, the inlet 113, the pressure chamber 114, the outlet 115, and the second buffer chamber 116, to be supplied to the secondary side of the piezoelectric pump 100. Note that the AC voltage to be applied to the piezoelectric element 103 is, for example, an AC voltage with a rectangular waveform of 100 Hz at 100 V.

The first buffer chamber 112 and the second buffer chamber 116 of the piezoelectric pump 100 thus configured respectively include the first and second gas chambers 112a and 116a by the first wall portion 112b and the second wall portion 116b. The first and second gas chamber 112a and 116a retain the gas 190 in liquid when the liquid moves. Therefore, when a bending displacement of the diaphragm 102 is repeatedly performed in the pressure chamber 114 and the pressure chamber 114 repeats flowing in and discharge of the liquid, the gas in the first gas chamber 112a of the first buffer chamber 112 and the second gas chamber 116a of the second buffer chamber 116 functions as a damper. Therefore, it is possible to absorb and diverge pressure fluctuations generated by a bending change of the diaphragm 102 to increase the flow volume.

Further, the wall portions 112b and 116b respectively form the first and second gas chambers 112a and 116a on the X direction side of the buffer chambers 112 and 116 in the posture in which the piezoelectric pump 100 is provided to the recording apparatus 1. Further, the wall portions 112b and 116b move liquid to the Y direction side of the respective buffer chambers 112 and 116, more specifically to the Y direction side than the first and second gas chambers 112a and 116a, and thus, the liquid is moved to a secondary side of the first and second buffer chambers 112 and 116. Therefore, it is possible to prevent the gas retained in the first and second gas chambers 112a and 116a from being discharged from the first and second gas chambers 112a and 116a to the secondary side of the first and second buffer chambers 112 and 116 by the flow of liquid.

Further, even if the piezoelectric pump 100 is provided to the recording apparatus 1 in the posture in which the first port 111 is disposed on the Y direction side and the second port 117 is disposed on the X direction side, the first gas chamber 112a and the second gas chamber 116a are capable of preventing gas from being discharged to the secondary side of the first and second buffer chambers 112 and 116 as illustrated in FIG. 2.

Note that as illustrated in FIG. 6, the piezoelectric pump 100 may be provided to the recording apparatus 1 in the posture in which the first port 111 is disposed on the X direction side and the second port 117 is disposed on the Y direction side. Note that as described above, the X direction is a direction opposite to the gravity direction, and the Y direction is the gravity direction. That is, even if the piezoelectric pump 100 is provided to the recording apparatus 1 in the posture illustrated in FIG. 6, the outlet 115 is disposed in the center of the second buffer chamber 116, so that the gas 190 can be retained in the first and second buffer chambers 112 and 116.

As described above, the piezoelectric pump 100 according to this embodiment is capable of retaining gas in the first and second buffer chambers 112 and 116 by the first and second wall portions 112b and 116b.

(Recording Apparatus 1)

Next, a recording apparatus 1 including the piezoelectric pump 100 will be described with reference to FIGS. 7 to 9.

As illustrated in FIGS. 7 to 9, the recording apparatus 1 includes a plurality of liquid ejection devices 10, a head support mechanism 11, a medium support mechanism 12, and a host control device 13. The head support mechanism 11 supports the liquid ejection devices 10 so as to be movable. The medium support mechanism 12 supports a recording medium S so as to be movable.

As illustrated in FIG. 7, the plurality of liquid ejection devices 10 are disposed in parallel in a predetermined direction and supported by the head support mechanism 11. Each liquid ejection device 10 incorporates a liquid ejection head 20 and a circulation device 30. Each liquid ejection device 10 ejects liquid, e.g., ink I, from the liquid ejection head 20 to form a desired image on a recording medium S. The recording medium S is disposed to face the liquid ejection device 10.

The plurality of liquid ejection devices 10 eject respective colors, e.g., cyan ink, magenta ink, yellow ink, black ink, and white ink, but the color and/or other characteristics of the ink I to be used are not limited. The liquid ejection device 10 can eject transparent and glossy ink, special ink whose color comes out when irradiated with infrared rays or ultraviolet rays, or other inks, in place of white ink, for example. The plurality of liquid ejection devices 10 have the same configuration but use different types of ink I, for example.

The liquid ejection head 20 is, for example, an inkjet head. As illustrated in FIG. 8, the liquid ejection head 20 includes a supply port 20a, in which the ink I flows, and a recovery port 20b, from which the ink I flows out. The liquid ejection head 20 includes, for example, a nozzle plate including a plurality of nozzle holes, a base plate including a plurality of ink pressure chambers, and a manifold joined to the base plate. The base plate includes predetermined inkflow paths between the plurality of ink pressure chambers and the nozzle plate.

Next, the circulation device 30 will be described. The circulation device 30 is, for example, integrally coupled to the upper portion of the liquid ejection head 20 by metal coupling parts. As illustrated in FIG. 8, the circulation device 30 includes a predetermined circulation path 31, a first circulation pump 33, a bypass flow path 34, a buffer tank 35, a second circulation pump 36, an on-off valve 37, and the module controller 38 that controls an operation of ejecting liquid. The circulation path 31 can cause the liquid to circulate through the liquid ejection head 20.

Further, as illustrated in FIG. 8, the circulation device includes a cartridge 51. The cartridge 51 is an ink replenishing tank (liquid supply tank) provided to the outside of the circulation path 31.

The cartridge 51 can contain the ink I, and the inner space of the cartridge 51 is opened to the atmosphere.

As illustrated in FIG. 8, the circulation path 31 includes a first flow path 31a, a second flow path 31b, a third flow path 31c, and a fourth flow path 31d. The first flow path 31a connects the cartridge 51 and the first circulation pump 33 to each other. The second flow path 31b connects the first circulation pump 33 and the supply port 20a of the liquid ejection head 20 to each other. The third flow path 31c connects the recovery port 20b of the liquid ejection head 20 and the second circulation pump 36 to each other. The fourth flow path 31d connects the second circulation pump 36 and the cartridge 51 to each other. The first flow path 31a and the fourth flow path 31d each include a pipe made of metal or resin material and a tube covering the outer surface of the pipe. The tube covering the outer surface of the pipe of each of the first flow path 31a and the fourth flow path 31d is, for example, a PTFE tube.

The ink I that circulates through the circulation path 31 passes, from the cartridge 51, through the first flow path 31a, the first circulation pump 33, the second flow path 31b, and the supply port 20a of the liquid ejection head 20, to reach the liquid ejection head 20. Further, the ink I that circulates through the circulation path 31 passes, from the liquid ejection head 20, through the recovery port 20b of the liquid ejection head 20, the third flow path 31c, the second circulation pump 36, and the fourth flow path 31d, to reach the cartridge 51.

The first circulation pump 33 is the piezoelectric pump 100. In the first circulation pump 33, the first port 111 is connected to the first flow path 31a, and the second port 117 is connected to the second flow path 31b. The first circulation pump 33 pumps out the liquid from the first flow path 31a toward the second flow path 31b. In other words, the first circulation pump 33 repeats pressurization and depressurization within the pressure chamber 114 by the operation of the piezoelectric element 103 and soaks up the ink I from the cartridge 51 to supply the ink I to the liquid ejection head 20. As illustrated in FIG. 2, for example, the piezoelectric pump 100 is provided in the posture in which the first port 111 is disposed on the Y direction side and the second port 117 is disposed on the X direction side.

As illustrated in FIG. 8, the bypass flow path 34 is a flow path that connects the second flow path 31b and the third flow path 31c to each other. The bypass flow path 34 simplistically connects the supply port 20a, which is the primary side of the liquid ejection head 20 in the circulation path 31, and the recovery port 20b, which is the secondary side of the liquid ejection head 20 in the circulation path 31, without passing through the liquid ejection head 20.

As illustrated in FIG. 8, the buffer tank 35 is connected to the bypass flow path 34. Specifically, the bypass flow path 34 includes a first bypass flow path 34a and a second bypass flow path 34b. The first bypass flow path 34a connects a predetermined lower portion of one of a pair of side walls of the buffer tank 35 and the second flow path 31b to each other. The second bypass flow path 34b connects a predetermined lower portion of the other one of the pair of side walls of the buffer tank 35 and the third flow path 31c to each other.

For example, the first bypass flow path 34a and the second bypass flow path 34b have the same length and diameter and each have the diameter smaller than a diameter of the circulation path 31. For example, the diameter of the circulation path 31 is set to approximately twice to five times the diameter of each of the first bypass flow path 34a and the second bypass flow path 34b. For example, in the first bypass flow path 34a and the second bypass flow path 34b, a distance between a position at which the second flow path 31b and the first bypass flow path 34a are connected to each other and the supply port 20a of the liquid ejection head 20 is set to be equal to a distance between a position at which the third flow path 31c and the second bypass flow path 34b are connected to each other and the recovery port 20b of the liquid ejection head 20.

A cross-sectional area of the flow path of the buffer tank 35 is larger than the cross-sectional area of the bypass flow path 34. The buffer tank 35 is formed to be capable of storing liquid. The buffer tank 35 is a rectangular box-like tank including, for example, an upper wall, a lower wall, a rear wall, a front wall, and the pair of right and left side walls, and includes a housing chamber 35a in which liquid is stored as illustrate in FIG. 8.

The position at which the first bypass flow path 34a and the buffer tank 35 are connected to each other and the position at which the second bypass flow path 34b and the buffer tank 35 are connected to each other are set at the same height. Within the buffer tank 35, the lower region of the housing chamber 35a contains the ink I flowing in the bypass flow path 34, and the upper region of the housing chamber 35a forms an air chamber 35b. In other words, the buffer tank 35 is capable of storing a predetermined amount of liquid and air. Further, the buffer tank 35 includes the on-off valve 37 and a pressure sensor 39. The on-off valve 37 can cause the air chamber 35b of the buffer tank 35 to be opened to the atmosphere.

The second circulation pump 36 is the piezoelectric pump 100. As illustrated in FIG. 8, in the second circulation pump 36, the first port 111 is connected to the third flow path 31c, and the second port 117 is connected to the fourth flow path 31d. The second circulation pump 36 pumps out the liquid from the third flow path 31c toward the fourth flow path 31d. In other words, the second circulation pump 36 recovers the ink I from the liquid ejection head 20 and replenishes the recovered ink I to the cartridge 51. As illustrated in FIG. 2, for example, the piezoelectric pump 100 is provided in the posture in which the first port 111 is disposed on the Y direction side and the second port 117 is disposed on the X direction side.

The on-off valve 37 is a normally-closed solenoid on-off valve, for example. The normally-closed solenoid on-off valve is opened when the power is turned on, and is closed when the power is turned off. The on-off valve 37 opens and closes the air chamber 35b of the buffer tank 35 with respect to the atmosphere by the control of the module controller 38.

The pressure sensor 39 detects a pressure of the air chamber 35b of the buffer tank 35 and sends pressure data, which indicates the value of the pressure, to the module controller 38. When the on-off valve 37 is opened and when the air chamber 35b of the buffer tank 35 is opened to the atmosphere, the pressure data detected by the pressure sensor 39 has a value equal to the value of an atmospheric pressure. The pressure sensor 39 detects a pressure of the air chamber 35b of the buffer tank 35 when the on-off valve 37 is closed and when the air chamber 35b of the buffer tank 35 is not opened to the atmosphere.

The pressure sensor 39 includes, for example, a semiconductor piezoresistive pressure sensor, and outputs the pressure as an electrical signal. The semiconductor piezoresistive pressure sensor includes a diaphragm and a semiconductor strain gauge. The diaphragm receives an external pressure. The semiconductor strain gauge is formed on a surface of the diaphragm. The semiconductor piezoresistive pressure sensor converts a change in electrical resistance into an electrical signal and detects a pressure, the change in electrical resistance being due to the piezoresistive effect produced in the strain gauge along with deformation of the diaphragm by the externa pressure.

As illustrated in FIG. 9, the module controller 38 controls the operation of the liquid ejection head 20, the first circulation pump 33, the second circulation pump 36, and the on-off valve 37. The module controller 38 includes a processor 71, a memory 72, a communication interface 73, circulation pump drive circuits 74, a valve drive circuit 76, and a liquid ejection head drive circuit 77.

The processor 71 is an arithmetic element to execute arithmetic processing, for example, a central processing unit (CPU) 71. The CPU 71 performs various types of processing on the basis of data such as programs stored in the memory 72. The CPU 71 is a control circuit that executes programs stored in the memory 72 to be capable of executing various types of control.

The memory 72 is storage to store various types of information. The memory 72 includes, for example, a read only memory (ROM) 72a and a random access memory (RAM) 72b.

The ROM 72a is a non-volatile read-only memory. The ROM 72a stores programs, data to be used in the programs, and the like. For example, the ROM 72a stores, as control data to be used for pressure control, a calculation formula for calculating an ink pressure of a nozzle hole, a target pressure range, and various set values such as maximum adjustment values of the respective pumps.

The RAM 72b is a volatile memory, which functions as a working memory. The RAM 72b temporarily stores data being processed by the CPU 71, or the like. Further, the RAM 72b temporarily stores programs to be executed by the CPU 71.

The communication interface 73 is an interface for communicating with another device. The communication interface 73 relays, for example, communication with the host control device 13, which sends print data to the liquid ejection device 10.

The circulation pump drive circuit 74 applies an AC voltage to the piezoelectric element 103 of the piezoelectric pump 100 under the control of the CPU 71 to drive the piezoelectric pump 100, thereby causing the ink I to circulate within the circulation path 31. The circulation pump drive circuits 74 are provided in the same number as the number of first circulation pump 33 and second circulation pump 36 and are respectively connected to the first circulation pump 33 and the second circulation pump 36. The circulation pump drive circuit 74 connected to the first circulation pump 33 applies a drive voltage to the piezoelectric element 103 of the first circulation pump 33. The circulation pump drive circuit 74 connected to the second circulation pump 36 applies a drive voltage to the piezoelectric element 103 of the second circulation pump 36.

The valve drive circuit 76 drives the on-off valve 37 under the control of the CPU 71 and causes the air chamber 35b of the buffer tank 35 to be opened to the atmosphere.

The liquid ejection head drive circuit 77 drives the liquid ejection head 20 by applying a voltage to the actuator of the liquid ejection head 20 under the control of the CPU 71, thereby causing the ink I to be ejected from the nozzle hole of the liquid ejection head 20.

In the configuration described above, the CPU 71 communicates with the host control device 13 through the communication interface 73 to receive various types of information such as operation conditions. Further, various types of information acquired by the CPU 71 are sent to the host control device 13 of the recording apparatus 1 through the communication interface 73.

Further, the CPU 71 acquires a detection result from the pressure sensor 39 and controls the operation of the circulation pump drive circuits 74 and the valve drive circuit 76 on the basis of the acquired detection result. For example, the CPU 71 controls the circulation pump drive circuits 74 on the basis of the detection result of the pressure sensor 39, thereby controlling the liquid pump-out capability of the first circulation pump 33 and the second circulation pump 36. Accordingly, the CPU 71 adjusts the ink pressure of the nozzle hole.

Further, the CPU 71 controls the valve drive circuit 76 to open and close the on-off valve 37. Accordingly, the CPU 71 adjusts the liquid level of the buffer tank 35.

Further, the CPU 71 acquires the detection result from the pressure sensor 39, and controls the liquid ejection head drive circuit 77 on the basis of the acquired detection result. The CPU 71 controls the liquid ejection head drive circuit 77 to cause ink droplets to be ejected on a recording medium from the nozzle hole of the liquid ejection head 20. Specifically, the CPU 71 inputs an image signal, which corresponds to image data, to the liquid ejection head drive circuit 77. The liquid ejection head drive circuit 77 drives the actuator of the liquid ejection head 20 corresponding to the image signal. When the liquid ejection head drive circuit 77 drives the actuator of the liquid ejection head 20, the actuator deforms, and thus, an ink pressure (nozzle surface pressure) of a nozzle hole located to face the actuator changes. The nozzle surface pressure is a pressure given by the ink I of the pressure chamber 114 to the meniscus formed by the ink I in the nozzle hole. When the nozzle surface pressure exceeds a predetermined value, which is defined by the shape of the nozzle hole, the characteristics of the ink I, and the like, the ink I is ejected from the nozzle hole. Accordingly, the CPU 71 causes an image, which corresponds to the image data, to be formed on the recording medium.

As described above, the recording apparatus 1 uses the piezoelectric pumps 100 as the first circulation pump 33 and the second circulation pump 36 of the circulation device 30 of the liquid ejection device 10. With this configuration, the cartridge 51 is set to be opened to the atmosphere, and the ink I circulating within the circulation path 31 contains the air bubbles 190. As illustrated in FIG. 2, for example, a part of the gas 190 is retained in the first and second gas chambers 112*a* and 116*a* of the buffer chambers 112 and 116 respectively provided to the first circulation pump 33 and the second circulation pump 36. Therefore, it is possible to absorb and diverge pressure fluctuations generated by a bending change of the diaphragm 102 of each of the first circulation pump 33 and the second circulation pump 36 to increase the flow volume. Therefore, the recording apparatus 1 can supply the ink I with a predetermined flow volume to the liquid ejection head 20 and stably control the ink pressure.

As described above, the recording apparatus 1 uses the piezoelectric pumps 100 as the first circulation pump 33 and the second circulation pump 36 and can thus retain gas in the buffer chambers 112 and 116.

Note that this embodiment is not limited to the example described above and can be embodied while modifying constituent elements without departing from the gist of this embodiment.

Figure 10:
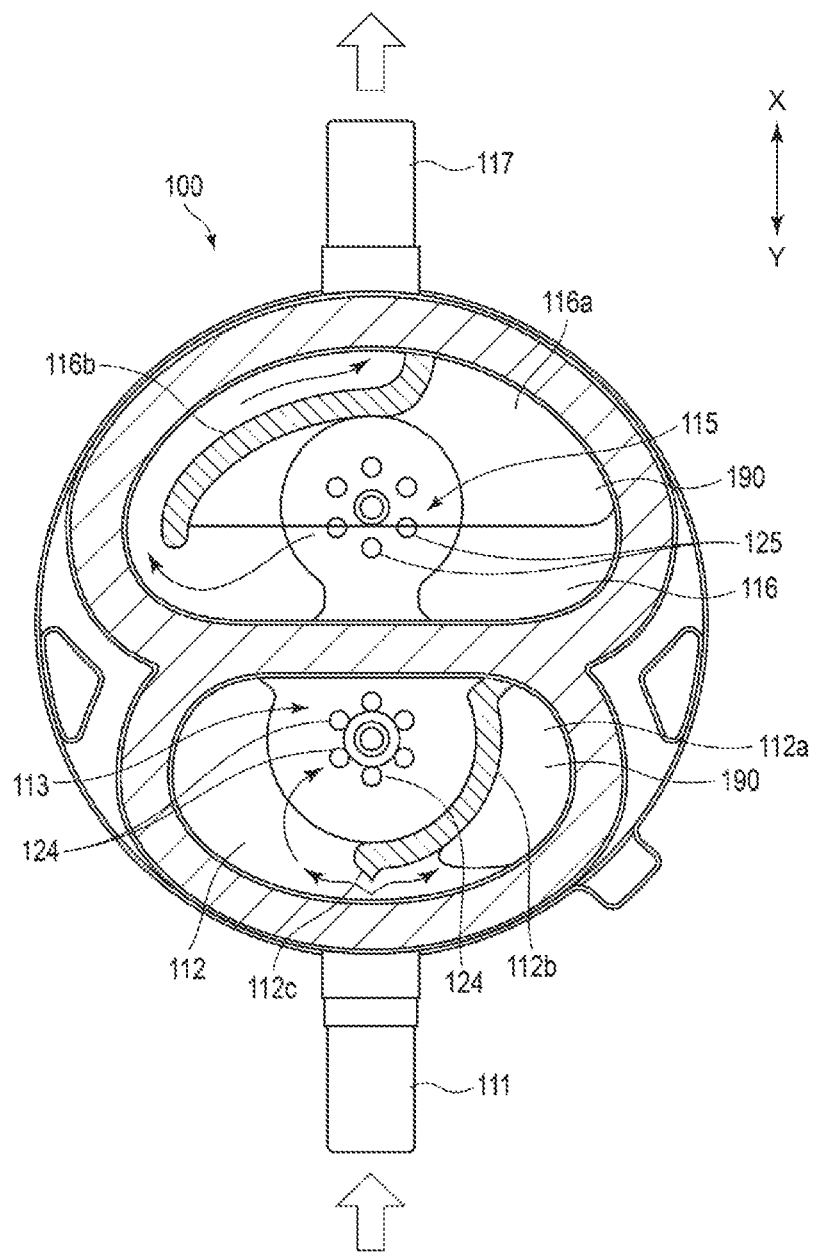
FIG. 10 is a cross-sectional view illustrating configurations of a first buffer chamber and a second buffer chamber of a piezoelectric pump according to another embodiment.

For example, an end of the first wall portion 112*b* provided to the first buffer chamber 112 of the piezoelectric pump 100 is disposed to face the first port 111 in the example described above, but this embodiment is not limited to such an example. FIG. 10 illustrates a piezoelectric pump 100 according to another embodiment. For example, as illustrated in FIG. 10, the first wall portion 112*b* may include a claw portion 112*c* at one end (the other end) of a first wall portion 112*b*, which faces a first port 111 in the direction in which liquid from the first port 111 flows. The claw portion 112*c* is formed to have a sharp end, for example. As a specific example, the claw portion 112*c* is formed in a triangular shape in plan view. With such a configuration, the liquid flown from the first port 111 is fractionated in two directions by the claw portion 112*c*, and the gas contained in the liquid is guided to the first gas chamber 112*a*. Therefore, the piezoelectric pump 100 can suitably retain the gas in the first gas chamber 112*a*.

Further, the end (other end) of the first wall portion 112*b* faces the first port 111 in the example described above, but this embodiment is not limited to such an example. That is, a part of the first wall portion 112*b* only needs to be disposed to face the first port 111 so that a part of gas contained in the liquid that has flown from the first port 111 into the first buffer chamber 112 is retained in the gas chamber 112*a*.

Figure 11:
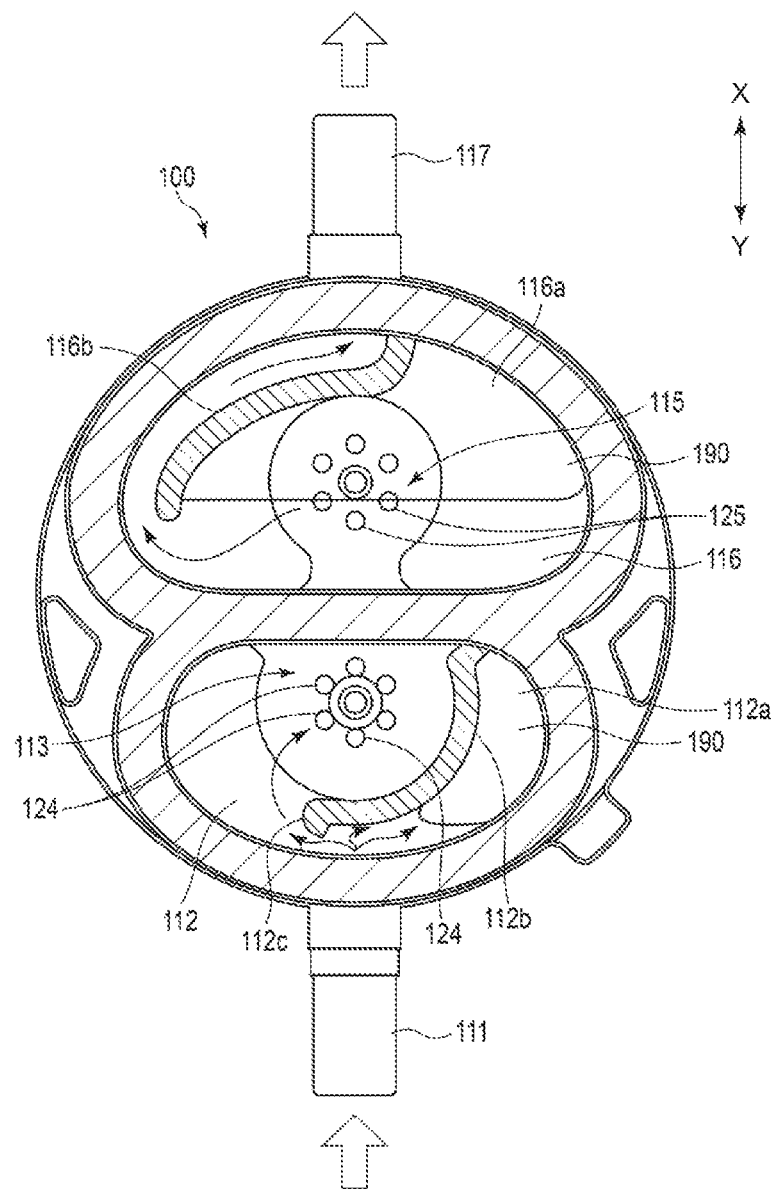
FIG. 11 is a cross-sectional view illustrating configurations of a first buffer chamber and a second buffer chamber of a piezoelectric pump according to still another embodiment.

For this reason, the other end side of the first wall portion 112*b* may face the first port 111. FIG. 11 illustrates the piezoelectric pump 100 according to another embodiment. That is, as illustrated in FIG. 11, the other end of the first wall portion 112*b* may be disposed away from the inner circumferential surface of the first buffer chamber 112 at a position beyond the first port 111 so that the first wall portion 112*b* extends from one end of the first wall portion 112*b* beyond the first port 111. Further, also in this case, the piezoelectric pump 100 may include the claw portion 112*c* having a sharp end at one end of the first wall portion 112*b*.

Figure 12:
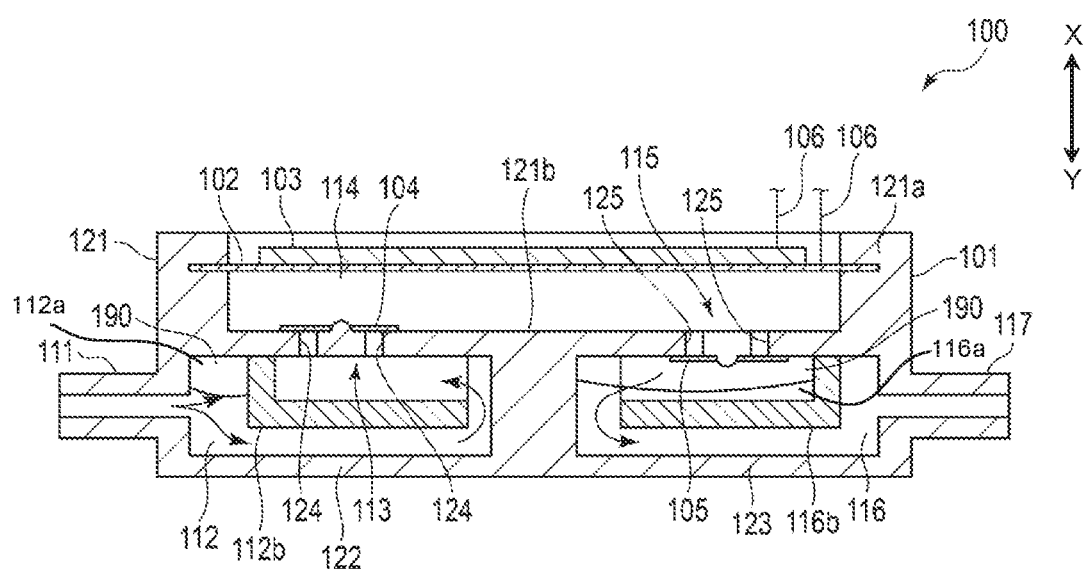
FIG. 12 is a cross-sectional view illustrating configurations of a first buffer chamber and a second buffer chamber of a piezoelectric pump according to still another embodiment.

Further, the piezoelectric pump 100 in which the first port 111 and the second port 117 are disposed in the XY direction (direction along the gravity direction) is provided to the recording apparatus 1 in the example described above (see, for example, FIG. 2), but this embodiment is not limited to such an example. FIG. 12 illustrates a piezoelectric pump 100 according to still another embodiment. As illustrated in FIG. 12, the piezoelectric pump 100 may be provided to the recording apparatus 1 in the posture in which the first port 111 and the second port 117 are disposed in the horizontal direction (direction perpendicular to the XY direction shown in FIG. 12). In such a case, the first and second wall portions 112*b* and 116*b* only need to partition the first and second buffer chambers 112 and 116 in the XY direction (direction along the gravity direction) so that the first and second gas chambers 112*a* and 116*a* are positioned on the X direction (direction opposite to the gravity direction) side of the buffer chambers 112 and 116.

Further, the piezoelectric pump 100 includes the first and second buffer chambers 112 and 116 and the first wall portion 112*b* and the second wall portion 116*b* are respectively provided to the first buffer chamber 112 and the second buffer chamber 116 in the example described above, but this embodiment is not limited to such an example. That is, in the piezoelectric pump 100, any of the first and second wall portions 112*b* and 116*b* may be provided to only any of the first and second buffer chambers 112 and 116. Further, the piezoelectric pump 100 may include only any of the first and second buffer chambers 112 and 116, and any of the first and second buffer chambers 112 and 116 may include a wall portion.

A piezoelectric pump, a liquid ejection device, and a recording apparatus at least one embodiment described above can retain gas in a buffer chamber by a wall portion.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A piezoelectric pump, comprising:
a pressure chamber having a variable volume, an inlet and an outlet being formed on a bottom portion of the pressure chamber, liquid being caused to flow in to the pressure chamber through the inlet and to be discharged from the pressure chamber through the outlet;
a diaphragm that deforms to change the volume of the pressure chamber;
a first check valve that is provided at the inlet and regulates a flow of the liquid;
a second check valve that is provided at the outlet and regulates the flow of the liquid;
a first buffer chamber that is provided out of the inlet;
a first port that is connected to an inner circumferential surface of the first buffer chamber and through which the liquid flows into the first buffer chamber;
a second port through which the liquid discharged from the pressure chamber flows out of the piezoelectric pump; and
a first wall portion that is provided in the first buffer chamber and forms a wall of a first gas chamber, the first wall portion comprising an arc portion having a first end that is spaced from the first port and faces the inner circumferential surface of the first buffer chamber on a side of the first port and a second end that is integrally provided on the inner circumferential surface of the first buffer chamber on a side of the second port, the arc portion being curved so as to avoid the inlet, the first gas chamber retaining gas in the liquid flowing in the first buffer chamber.

2. The piezoelectric pump according to claim 1, wherein the diaphragm is provided to face the bottom portion of the pressure chamber,
the bottom portion of the pressure chamber has a groove, and
the inlet and the outlet are formed on a bottom portion of the groove and fluidly connected to each other.

3. The piezoelectric pump according to claim 1, further comprising:
a second buffer chamber that is provided out of the outlet, wherein
the second port is connected to the second buffer chamber and the liquid flows out of the second buffer chamber through the second port.

4. The piezoelectric pump according to claim 3, further comprising:
a second wall portion that is provided in the second buffer chamber and forms a wall of a second gas chamber retaining gas in the liquid discharged from the pressure chamber to the second buffer chamber through the outlet.

5. The piezoelectric pump according to claim 4, wherein the first wall portion includes a claw portion at the first end.

6. The piezoelectric pump according to claim 4, wherein the second port is connected to an inner circumferential surface of the second buffer chamber, and
the second wall portion comprises a second arc portion having a first end that is spaced from the inner circumferential surface of the second buffer chamber on a side of the first buffer chamber and a second end that is integrally provided on the inner circumferential surface of the second buffer chamber on a side of the second port, the second arc portion being curved so as to avoid the outlet.

* * * * *